United States Patent [19]

Kim

[11] Patent Number: 5,716,887

[45] Date of Patent: Feb. 10, 1998

[54] METHOD OF MANUFACTURING BICMOS DEVICE

[75] Inventor: Cheol-Joong Kim, Kyungki-do, Rep. of Korea

[73] Assignee: Samsung Elecronics Co., Ltd., Suwon, Rep. of Korea

[21] Appl. No.: 710,111

[22] Filed: Sep. 13, 1996

[30] Foreign Application Priority Data

Sep. 14, 1995 [KR] Rep. of Korea ............... 95-30121

[51] Int. Cl.$^6$ .................................................. H01L 21/265
[52] U.S. Cl. .................. 438/309; 438/318; 438/326; 438/370; 438/371; 438/358
[58] Field of Search ............................. 437/26, 76, 74, 437/78, 89, 90, 59, 31, 309, 318, 326, 370, 371, 358

[56] References Cited

U.S. PATENT DOCUMENTS 5,110,749  5/1992  Ikeda ............................. 437/26

Primary Examiner—John Niebling
Assistant Examiner—Long Pham
Attorney, Agent, or Firm—Cushman Darby & Cushman IP Group of Pillsbury Madison & Sutro LLP

[57] ABSTRACT

A semiconductor device and a method for manufacturing such a device are presented. The type of semiconductor device is one which merges one type of transistor (e.g., bipolar junction transistors) with another type (e.g., CMOS transistors). Specifically, the semiconductor device may comprise a semiconductor substrate and first buried layers of a first conductive and second type buried layers of a second conductive type both formed within the semiconductor substrate. The first buried layers are preferably at a different level within the semiconductor substrate then the level of the second buried layers. First epitaxial layer portions are formed over the first buried layers and second epitaxial layer portions are formed over the second type buried layers. Isolation regions are formed on the first epitaxial layer portions. In forming the semiconductor substrate, photoresists are formed at regular spatial intervals on a substrate. Exposed portions of the substrate are then etched to form etched portions of the substrate, and ions of a second conductive type are implanted into the etched portions of the substrate. The photoresists are then removed, and ions of a first conductive type are then implanted into the substrate. Accordingly, the first and second type buried layers are formed within the substrate, the first buried layers being positioned at a first level and the second buried layers being positioned at a second level lower than the first level.

16 Claims, 5 Drawing Sheets

METHOD OF MANUFACTURING BICMOS DEVICE

BACKGROUND OF THE INVENTION

1. Field of the Invention

The present invention relates in general to a semiconductor device and a method for manufacturing the same. More particularly, the present invention relates to a semiconductor device which merges one type of transistor (e.g., bipolar junction transistors) with another type (e.g., CMOS transistors).

2. Description of Related Art

BiCMOS technology integrates both CMOS and bipolar device structures on the same chip. In general, when integrating high speed bipolar devices and high packing density integrated CMOS devices on the same chip, the of the resulting device structure performance is reduced. In view of this, a modified thin-well BiCMOS process has been widely used for making high-performance, high-density BiCMOS ICs.

A conventional semiconductor device will now be described with reference to the accompanying drawings. FIG. 1 is a cross-sectional view of a conventional semiconductor. It represents conventional BiCMOSs in their intermediate phase during formation of the same. Such a semiconductor may be formed as disclosed by S. Wolf in "Silicon Processing for the VLSI Era," Vol. 2 Lattice Press, Sunset Beach, Calif. (1987), pages 543–565, the content of which is hereby expressly incorporated by reference herein in its entirety.

As shown in FIG. 1, a substrate 110 is provided which comprises $N^+$ buried layers 114 which are horizontally spaced apart at regular intervals within substrate 110. P buried layers 112 are formed between adjacent $N^+$ buried layers 114, forming P-$N^+$ junctions. N wells 115 are formed on respective $N^+$ buried layers 114, and P wells 113 are formed on respective P buried layers 112, forming N well and P well junctions.

In order to fabricate an NPN transistor within the illustrated BiCMOS device, a first deep $N^+$ region 119a may be formed within one N well 115. The first deep $N^+$ region 119a has a contact area in contact with the $N^+$ buried layer 114 beneath the N well 115. In order to fabricate a capacitor, a second deep $N^+$ region 119b may be formed within a P well 113. The second deep $N^+$ region 119b has a contact area in contact with a P buried layer 112 where the deep $N^+$ region 119 forms a contact area with P buried layer 112.

A plurality of field oxide films 126 may be provided at certain locations at the surface of substrate 110, each field oxide film 126 being connected to both a P well 113 and an N well 115. Field oxide fills 126 serve to isolate P wells 113 from N wells 115.

FIGS. 2–9 illustrate substrate 110 at various stages within a process for fabricating a conventional semiconductor device such as the device illustrated in FIG. 1. In a first step of the process, as shown in FIG. 2, a first oxide film 120 is deposited on a P substrate 110. A silicon nitride ($Si_3N_4$) film 130 is then deposited on first oxide film 120. Photoresists 150 are deposited at regular spatial intervals over the top of the resulting substrate 110 as shown in FIG. 2, using a photography process to produce P buried layers. An ion implantation step is then performed.

As shown in FIG. 3, the silicon nitride ($Si_3N_4$) film 130 is etched and photoresist 150 is then removed, resulting in the device. A selective oxidation is then performed to concurrently form thick oxide films 121 and P buried layers 112.

Referring to FIG. 4, following formation of oxide films 121 and P buried layers 112, the entire first oxide films 120, which were deposited lightly on $Si_3N_4$ film 130 and substrate 110, are removed. A second oxide film 122 is then deposited. An ion-implantation process is then successively conducted on the resulting second oxidation film 122 to form $N^+$ buried layers.

Referring to FIG. 5, $N^+$ buried layers 114 are deposited at both sides of each P buried layer 112, forming P-$N^+$ junctions therebetween. An etching process is then performed to remove the entire oxidation films 121 and 122. An ion-implantation step is utilized to form an epitaxial layer 118 over buried layers 112 and 114. A third oxidation film 123 is lightly grown on substrate 110, and a $Si_3N_4$ film 132 is then deposited on third oxidation film 123. A photograph process is then used to form photoresists 152 on $Si_3N_4$ film 132. Photoresists 152 are positioned over P buried layers 112.

Referring to FIG. 6, following formation of photoresists 152, as shown in FIG. 5, subsequent steps are then performed. More particularly, $Si_3N_4$ film 132 is etched and patterned, and ion-implantation is then performed over the entire substrate 110.

As shown in FIG. 7, photoresists 152 are removed from substrate 110. An oxide is heavily deposited to form thick oxide films 124, and N wells 115 are formed concurrently with the depositing of the oxide. $Si_3N_4$ films 132 are removed, and ion-implantation is performed on the entire substrate 110.

Referring to FIG. 8, an etching process is performed to remove all of oxide films 123 and 124 from substrate 110. A shallow fourth oxide film 125 is then formed. An $Si_3N_4$ film 134 is then deposited at certain locations at a top surface of substrate 110 over fourth oxide film 125. The formed $Si_3N_4$ film 134 is then patterned using a photoetching process, resulting in films 134 being provided at certain locations on the surface of substrate 110.

Referring to FIG. 9, a selective oxidization is then performed to form field oxide films 123. Photoresists 154 and $Si_3N_4$ films 134 are then removed using an etching process. A deep $N^+$ region is then formed with the use of photography and ion-implantation steps.

In a typical semiconductor, the nMOS (n-channel) device and a capacitor are formed in the P wells that are isolated from each other by each field oxide film 126, while a pMOS (p-channel) device and a bipolar device are formed in the N wells. Accordingly, a conventional semiconductor device such as that provided in FIG. 1 can provide a high-performance, high-density BiCMOS IC.

However, three photoresist masks are required in order to form P and N buried layers as well as P and N wells in the device shown in FIG. 1. Accordingly, the process required to form these layers and wells is complex and costly.

In a typical semiconductor, such as the one illustrated in FIG. 1, the P buried layers and the N buried layers are deposited along a straight line, forming P-N junctions. The epitaxial layers are deposited on the P and N buried layers, and the wells are formed by diffusing ions implanted into the epitaxial layers. With this process, the respective wells and buried layers have equal depth, and each device formed within the wells is driven at a similar voltage. This presents difficulty when attempting to integrate a high voltage device and a low voltage device on the same chip.

SUMMARY OF THE INVENTION

In view of the above, an object of the present invention is to provide a semiconductor device which facilitates integration of a high voltage device and a low voltage device on the same chip. A further object of the present invention is to provide a method for manufacturing such a semiconductor device.

The present invention, therefore, is directed to a semiconductor device and a method for making the same. The semiconductor device may comprise a first buried layer of a first conductive type and a second buried layer of a second conductive type. Each of the first and second type buried layers may be formed in a semiconductor substrate, the first and second type buried layers being formed at different levels within the substrate. More specifically, a plurality of the first buried layers may be formed at a first level within the substrate, and a plurality of the second buried layers may be formed at a second (different) level within the substrate. The first level may be higher (at a shallower depth) then the second level.

An epitaxial layer is formed on the first and second buried layers. Isolation regions are formed in portions of the epitaxial layer which are over the first buried layers in order to isolate these portions of the epitaxial layer from other portions.

In fabricating such a semiconductor device, photoresists may be formed at regular intervals on a substrate. The substrates may then be etched and ions of a second conductive type may be implanted into the etched portion. The photoresists may be removed and ions of a first conductive type may be implanted into the substrate. First buried layers of the first conductive type and second type buried layers of the second conductive type may each be formed at different levels into the substrate. Such buried layers may be formed by diffusing ions of first and second respective conductive types into the substrate.

A first epitaxial layer is formed on the substrate by performing epitaxial layer growth and planarizing the surface of the substrate. First isolation regions are formed at regular spatial intervals in portions of the first epitaxial layer which are directly over the first buried layers, and first sink regions are concurrently formed at regular spatial intervals in portions of the first epitaxial layer which are directly over the second buried layers. A second epitaxial layer is then formed on the substrate by utilizing epitaxial layer growth and second isolation regions and second sink regions are concurrently formed directly over respective ones of the first isolation regions and the first sink regions.

In the resulting semiconductor, the first and second conductive buried layers are at different levels within the substrate. Thus, the portions of the epitaxial layers formed over the first and the second conductive buried layers have different depths.

DETAILED DESCRIPTION OF THE PREFERRED EMBODIMENTS

Figure 10:
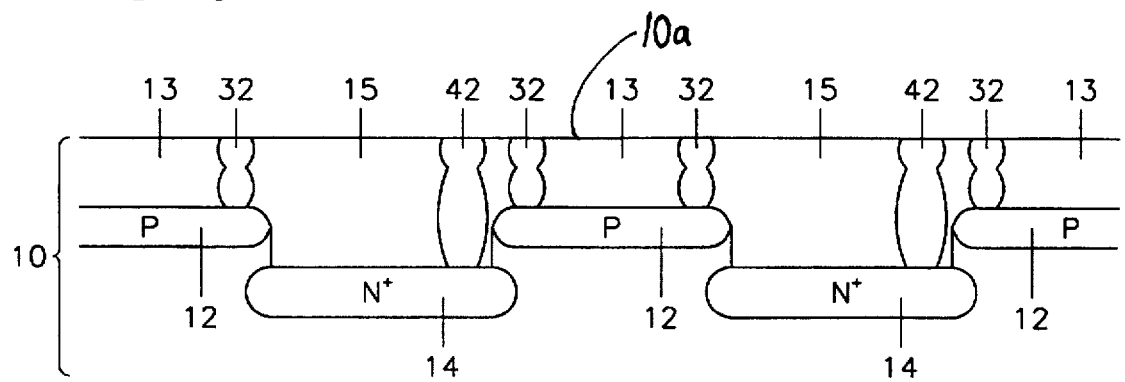
FIG. 10 is a cross-sectional view of a semiconductor device in accordance with an illustrative embodiment of the present invention.

Referring now to the drawings in greater detail, FIG. 10 illustrates a cross-sectional view of a semiconductor device which may be formed in accordance with an illustrated embodiment of the present invention. As shown in FIG. 10, P buried layers 12 are provided at regular spatial intervals within a substrate 10. $N^+$ buried layers 14 are provided at a lower position within substrate 10, and between adjacent P buried layers 12. Each of $N^+$ buried layers 14 is at a lower level than the adjacent P buried layers 12. Accordingly, P buried layers 12 form upper buried layers and $N^+$ buried layers form lower buried layers.

Respective epitaxial layers (layer portions) 13 and 15 (together forming a combined epitaxial layer) are provided on the upper and lower buried layers 12 and 14. The top surfaces of the epitaxial layers 13 and 15 are at the same height. Substrate 10, therefore has a planar, flat upper surface 10a. Accordingly, epitaxial layers 15, which are provided over $N^+$ buried layers 12, are deeper than those epitaxial layers 13 provided over P buried layers 12. In the embodiment shown in FIG. 10, the epitaxial layers 13 on P buried layers 12 have a depth of approximately between 2 and 3 µm, and the epitaxial layers 15 on the $N^+$ buried layers 14 have a depth of approximately between 3 and 4 µm.

Substrate 10 further includes pairs of isolation regions 32 which extend from an upper surface 10a of substrate 10 down to an upper surface of each P buried layer 12. Each pair of isolation regions 32 includes a first isolation region at a left end of a P buried layer 12 and a second isolation region at a right end of P buried layer 12. Substrate 10 may further comprise a sink region 42 for each $N^+$ buried layer 14. Each sink region 42 extends from an upper surface 10a of substrate 10 down to an upper surface of its respective $N^+$ buried layer 14. More specifically, each sink region 42 is provided at a right end of its respective $N^+$ buried layer 14.

FIGS. 11–14 illustrate substrate 10 as it goes through the various stages of a manufacturing process in order to produce substrate 10 as illustrated in FIG. 10.

Figure 11:
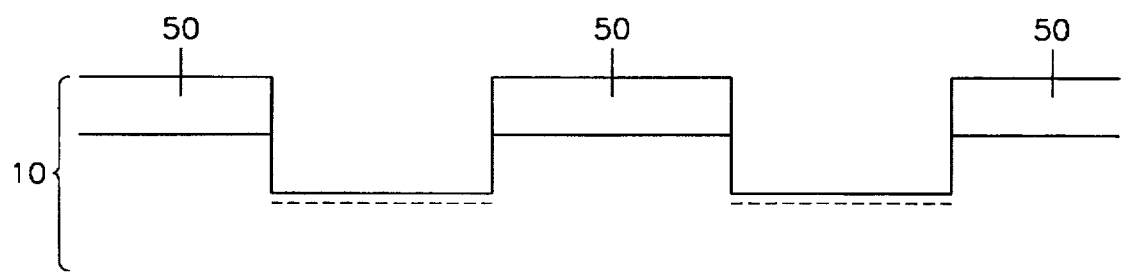
FIGS. 11–15 show various stages of a semiconductor in performing a process sequence for fabricating the semiconductor device illustrated in FIG. 10.

As shown in FIG. 11, the process begins by forming photoresists 50 on selected portions of substrate 10 at regular spatial intervals on substrate 10. Patterning and etching are then performed. That is, substrate 10 is patterned etching away regions of substrates using, for example, a chemical solvent or a dry etchant. Ion-implantation is then performed, which may comprise the implantation of $N^+$ ions in the amount of 1–5 $E^{15}$ ions/cm$^2$ into substrate 10.

Figure 12:
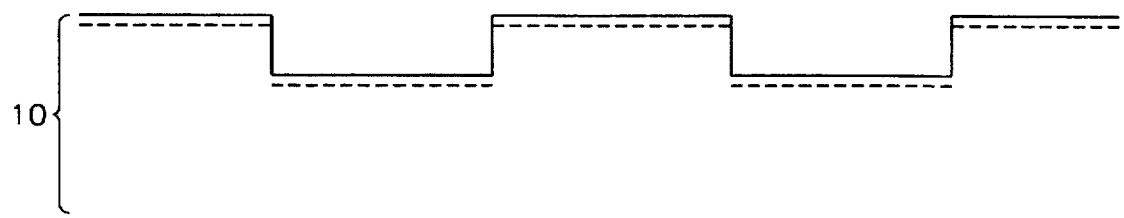
Figure 13:
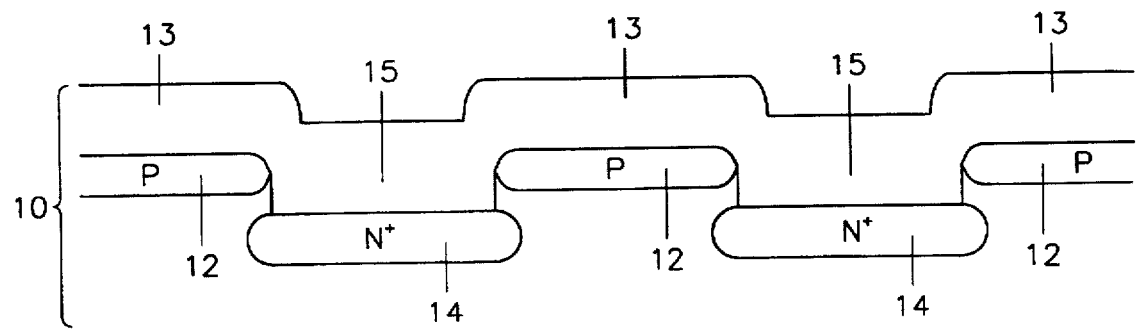

Referring to FIG. 12, photoresists 50 are then removed from substrate 10, and P ions having a distribution of 1–3 $E^{13}$ ions/cm$^2$ are implanted into substrate 10. Following the ion implantation, the device is transformed to that shown in FIG. 13. More specifically, $N^+$ buried layers 14 and P buried layers 12 are formed by ion diffusion. Since $N^+$ buried layers 14 are formed at etched portions of substrate 10 and P buried layers 12 are formed at non-etched portions, a step (i.e., a significant height difference) exists between P buried layers 12 and N buried layers 14. Epitaxial layers 13 and 15 are then grown over the P buried layers 12 and N buried layers 14, respectively. Each of the epitaxial layers 13 and 15 is grown at a depth of between 4 and 5 µm.

Figure 14:
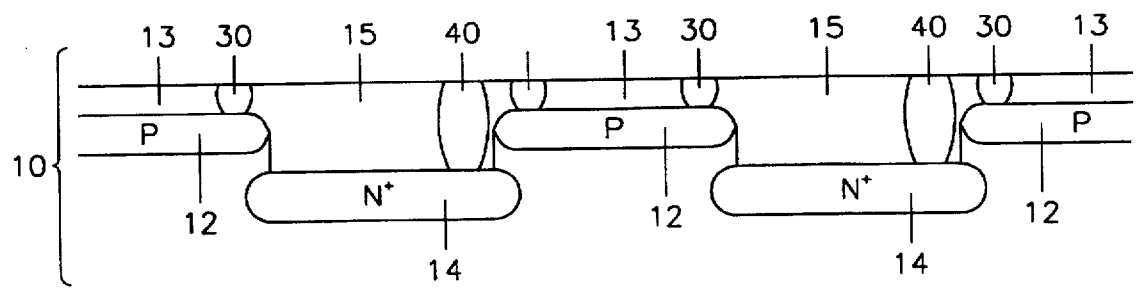

Substrate 10 is then planarized, resulting in a substrate 10 as shown in FIG. 14. Isolation regions 30 and sink regions 40 are then formed in epitaxial layers 13 and 15. These regions are concurrently formed by ion implantation and diffusion. At this time, after planarization has been performed, epitaxial layers 13 which are provided over P buried layers 12 have a depth of about 1–2 µm, while epitaxial layers 15 which are provided over $N^+$ buried layers have a depth of about 2–3 µm.

A pair of isolation regions 30 is formed within an epitaxial layer 13 on each P buried layer 12. Each isolation region 30 of the pair is formed at a respective one of two ends of each P buried layer 12. A single sink region 42 is formed within epitaxial layer 15 over each respective N+ buried layer 14, at a right upper surface portion of buried N+ buried layer 14. At this stage of the process as shown in FIG. 14, the amount of volume (corresponding to the amount of cross-sectional area shown in to the figures) of these isolation regions and sink regions is relatively small. That is, they are not completely formed yet.

Sink regions 40 and 42 function as collectors of NPN bipolar transistors and isolation regions 30 and 32 function as insulators of such devices. Such regions and the process used to form those regions are well known in the art.

Figure 1:
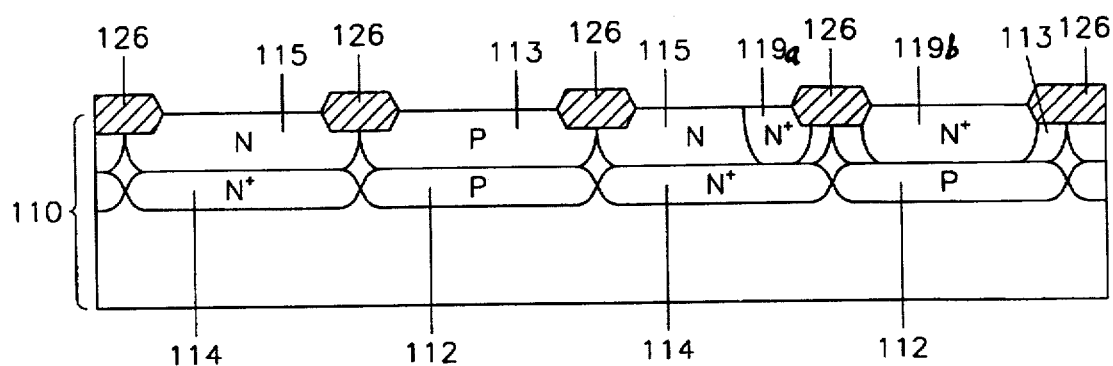
FIG. 1 shows a cross-sectional view of a conventional semiconductor device.
Figure 2:
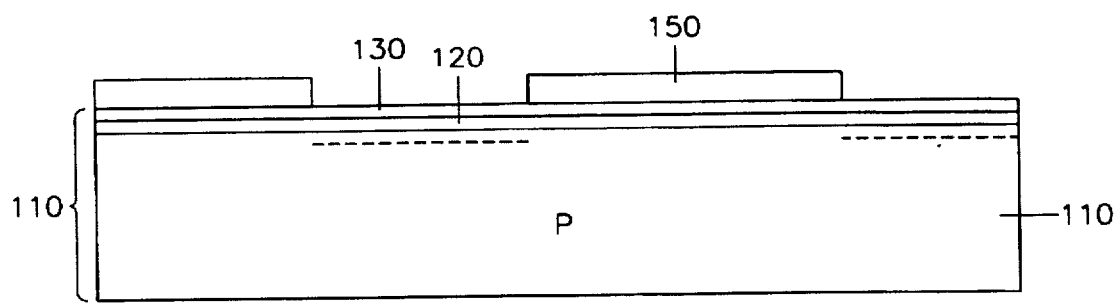
FIGS. 2–9 show various stages of a semiconductor utilizing a process for fabricating the semiconductor device of FIG. 1.
Figure 3:
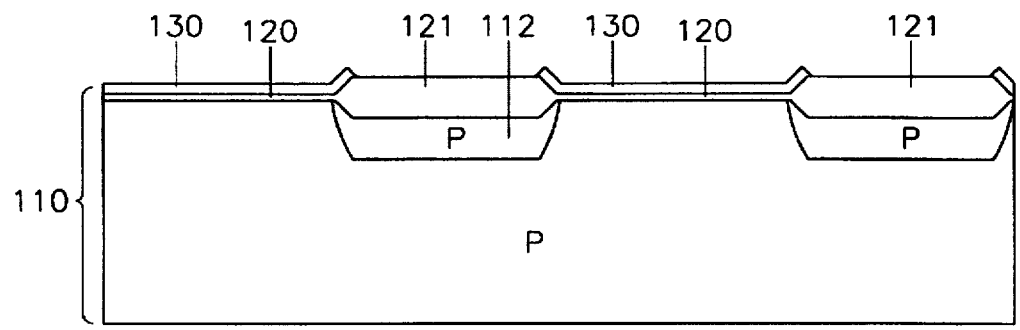
Figure 4:
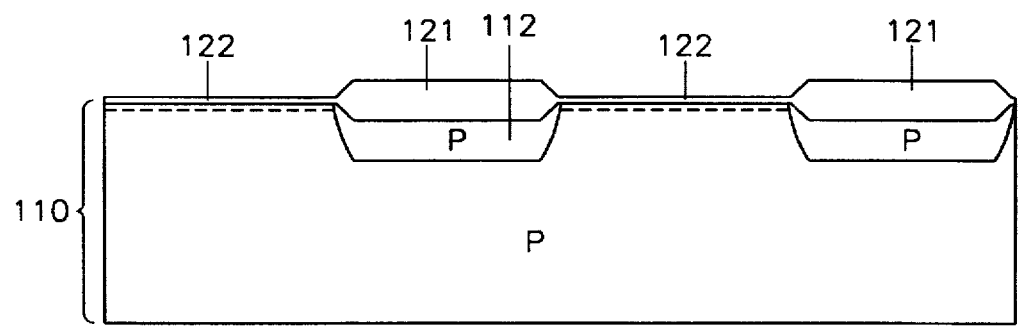
Figure 5:
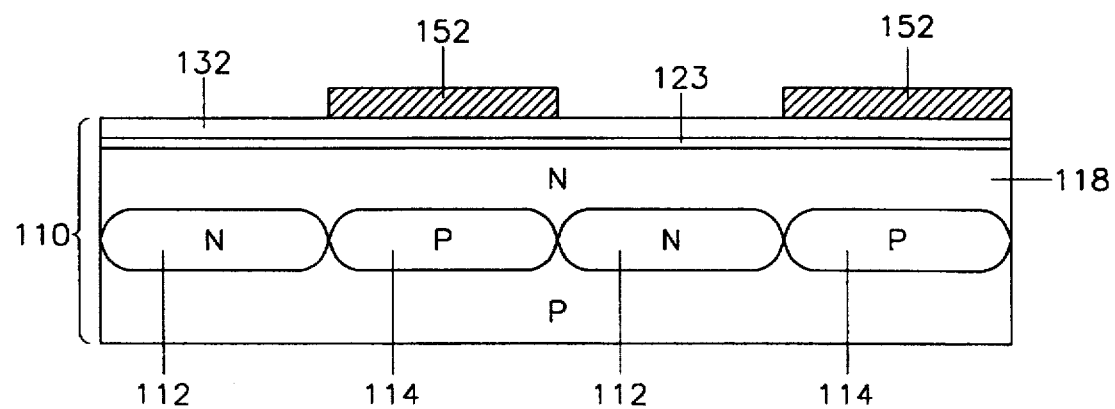
Figure 6:
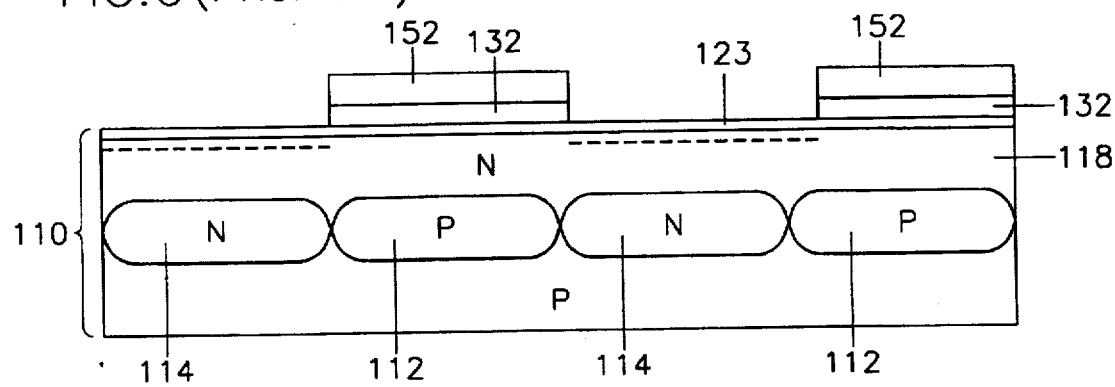
Figure 7:
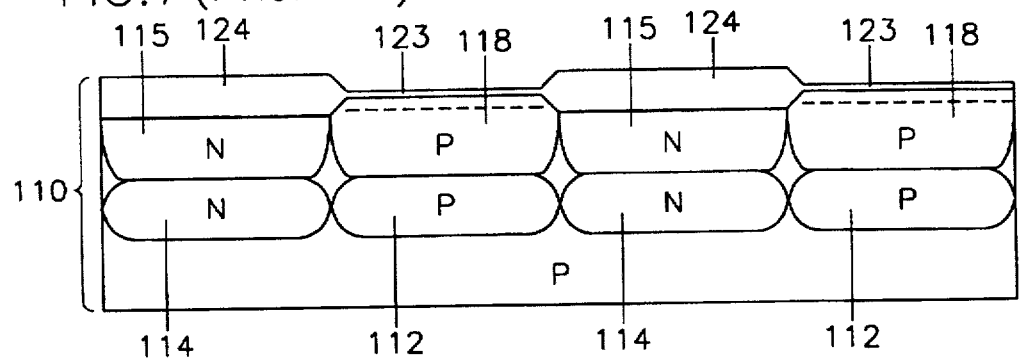
Figure 8:
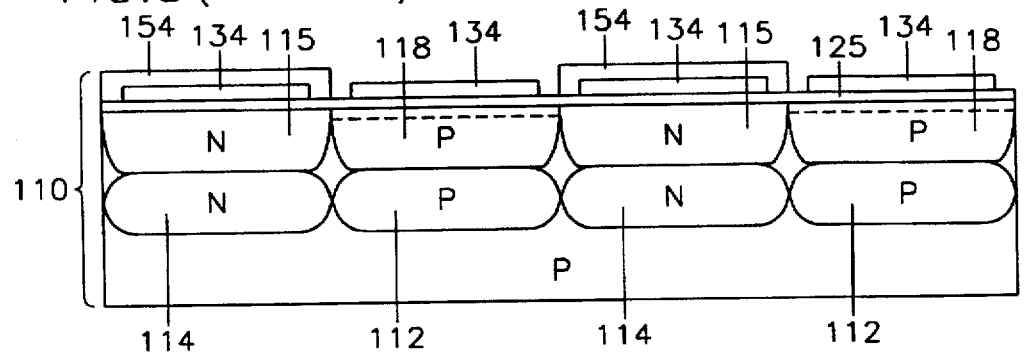
Figure 9:
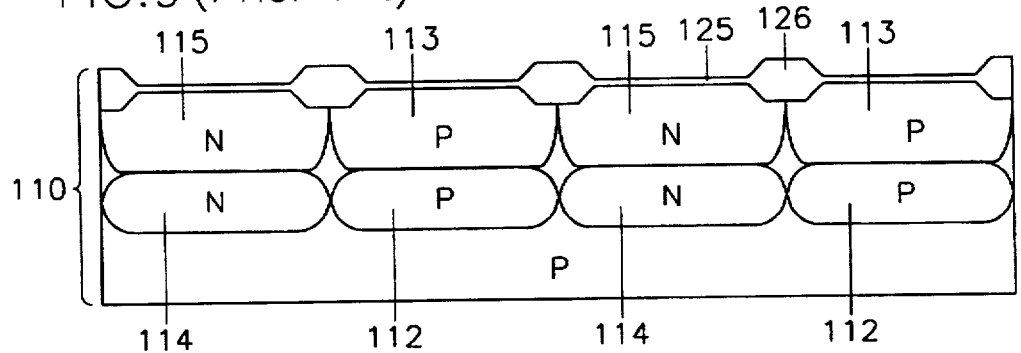

In a conventional device, such as is shown in FIG. 1, a P buried layer 112 and an N+ buried layer 114 are each formed at the same depth from the surface of the semiconductor substrate 110. However, in accordance with the present invention, for example, in the specific embodiment shown in FIG. 10, the depth of the P buried layers 12 is shallower than the depth of a conventional P buried layer, while the depth of the N+ buried layers 14 is at a comparable depth as that of the conventional N+ buried layers. Boron may be utilized to form isolation regions 30, while phosphorous is utilized for forming sink regions 40. Boron diffuses at a slower rate than does phosphorous. Accordingly, when forming both isolation regions 30 and sink regions 40, if the amount of time it takes to diffuse and thereby form isolation regions 30 is reduced, by making the depth of the P buried layers shallower, the overall diffusion time for both isolation regions 30 and sink regions 40 is minimized. In other words, the total diffusion time for isolation regions 30 and sink regions 40 in a conventional device is dictated by the time it takes for the isolation region 30 to come into contact with the P buried layer 12, since the boron (used to form isolation regions 30) is diffused at a slower rate than phosphorous (used to form sink regions 40).

Lateral diffusion is proportional to the total diffusion time as well. Accordingly, the lateral diffusion for the isolation and sink regions, respectively, are decreased. Therefore, the total area taken along a cross-section occupied by isolation regions 30 and sink regions 40 is significantly reduced. This allows the overall chip size to be reduced.

Figure 15:
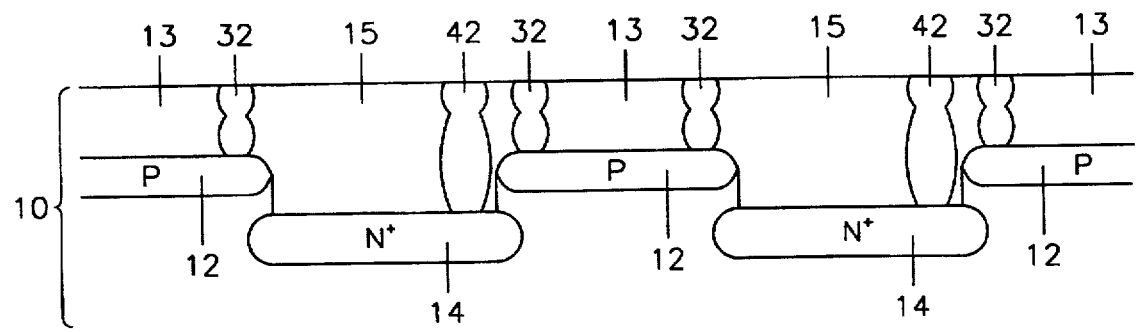

As shown in FIG. 15, epitaxial growth is again performed and isolation regions 32 and sink regions 42 are formed with the occurrence of upward diffusion. That is, the formation of those regions is completed with the use of an additional step of epitaxial growth.

Additional processing steps may be performed on substrate 10 in accordance with conventional processes. Sink region 42 may be omitted, or formed in other regions, depending upon the type of device being formed and other considerations. Depending upon whether a sink region 42 is formed, and the location of such region, various different transistors, including CMOS, NMOS, PMOS, BiCMOS and BIPOLAR type transistors may be formed.

In the semiconductor device, buried layers are provided at different levels within substrate 10, and epitaxial layers are deposited over the buried layers at varying depths in accordance with the levels of the buried layers. As a result, both high voltage devices and low voltage devices can be integrated on the same chip, and a high-performance semiconductor can be formed. The process for forming these layers also reduces the mount of diffusion time needed for forming isolation and sink regions. In addition, only one mask is necessary to form the buried layers different levels. Accordingly, the process for forming such a device is significantly simplified.

It is understood that various other modifications will apparent to and can be readily made by those skilled in the art without departing from the scope and spirit of this invention. Accordingly, it is not intended that the scope of the claims appended hereto be limited to the description as set forth herein, but rather that the claims be construed as encompassing all of the features of patentable novelty that reside in the present invention, including all features that would be treated as equivalents thereof by those skilled in the art with which this invention pertains.

The present disclosure is related to Korean patent application No. 30121, filed Sep. 14, 1995, the content of which is hereby expressly incorporated herein by reference in its entirety.

What is claimed is:

1. A method for fabricating a semiconductor device, said method comprising the steps of:

forming photoresists at equally spaced intervals on a substrate, subsequently etching exposed portions of said substrate to form etched portions of said substrate while said photoresists are on said substrate, and implanting ions of a second conductive type into said etched portions of said substrate;

removing said photoresists and subsequently implanting ions of a first conductive type into said substrate;

forming first buried layers of said first conductive type and second buried layers of said second conductive type, said first and second buried layers being alternately formed along a horizontal direction within said substrate, said first buried layers being positioned at a first level and said second buried layers being positioned at a lower second level;

forming a first epitaxial layer on said substrate by epitaxial layer growth and subsequently planarizing an upper surface of said first epitaxial layer to form a planar upper surface of said substrate;

forming first isolation regions at equally spaced intervals in said first epitaxial layer, said first isolation regions being formed on respective ones of said first buried layers, and forming first sink regions at equally spaced intervals in said first epitaxial layer, said first sink regions being formed on respective ones of said second buried layers; and forming a second epitaxial layer on said first epitaxial layer by epitaxial layer growth and forming second isolation regions as continuations of said first isolation regions and second sink regions as continuations of said first sink regions.

2. The method according to claim 1, wherein said first conductive buried layers comprise P-type buried layers and said second conductive buried layers comprise N+-type buried layers.

3. The method according to claim 1, wherein ions of said second conductive are implanted into said substrate at a concentration of 1–5 $E^{15}$ ions/cm$^2$.

4. The method according to claim 1, wherein ions of said first conductive type are implanted into said substrate at a concentration of 1–3 $E^{13}$ ions/cm$^2$.

5. The method according to claim 1, wherein said first epitaxial layer has a depth of approximately between 4 and 5 μm before said step of planarizing.

6. The method according to claim 1, wherein portions of said first epitaxial layer have a thickness of approximately between 1 and 2 μm after said step of planarizing.

7. The method according to claim 6, wherein portions of said first epitaxial layer have a thickness of approximately between 2 and 3 μm after said step of planarizing.

8. The method according to claim 1, wherein portions of said first epitaxial layer have a thickness of approximately between 2 and 3 μm after said step of planarizing.

9. A method for fabricating a semiconductor device, said method comprising the steps of:

forming photoresists at spaced intervals on a substrate, subsequently etching exposed portions of said substrate to form etched portions of said substrate while said photoresists are on said substrate, and implanting ions of a second conductive type into said etched portions of said substrate;

removing said photoresists and subsequently implanting ions of a first conductive type into said substrate;

forming first buried layers of said first conductive type and second buried layers of said second conductive type, said first and second buried layers being alternately formed along a horizontal direction within said substrate, said first buried layers being positioned at a first level and said second buried layers being positioned at a lower second level;

forming a first epitaxial layer on said substrate by epitaxial layer growth and subsequently planarizing an upper surface of said first epitaxial layer to form a planar upper surface of said substrate;

forming first isolation regions at spaced intervals in said first epitaxial layer, said first isolation regions being formed on respective ones of said first buried layers, and forming first sink regions at spaced intervals in said first epitaxial layer, said first sink regions being formed on respective ones of said second buried layers; and forming a second epitaxial layer on said first epitaxial layer by epitaxial layer growth and forming second isolation regions as continuations of said first isolation regions and second sink regions as continuations of said first sink regions.

10. The method according to claim 9, wherein said first conductive buried layers comprise P-type buried layers and said second conductive buried layers comprise N+-type buried layers.

11. The method according to claim 9, wherein ions of said second conductive are implanted into said substrate at a concentration of $1–5 \ E^{15}$ ions/cm$^2$.

12. The method according to claim 9, wherein ions of said first conductive type are implanted into said substrate at a concentration of $1–3 \ E^{13}$ ions/cm$^2$.

13. The method according to claim 9, wherein said first epitaxial layer has a depth of approximately between 4 and 5 μm before said step of planarizing.

14. The method according to claim 9, wherein portions of said first epitaxial layer have a thickness of approximately between 1 and 2 μm after said step of planarizing.

15. The method according to claim 14, wherein portions of said first epitaxial layer have a thickness of approximately between 2 and 3 μm after said step of planarizing.

16. The method according to claim 9, wherein portions of said first epitaxial layer have a thickness of approximately between 2 and 3 μm after said step of planarizing.

* * * * *